United States Patent
Lee et al.

(10) Patent No.: US 9,070,650 B2
(45) Date of Patent: Jun. 30, 2015

(54) ORGANIC LIGHT EMITTING DISPLAY APPARATUS AND METHOD OF INSPECTING PATTERNS OF THE ORGANIC LIGHT EMITTING DISPLAY APPARATUS

(75) Inventors: June-Woo Lee, Yongin (KR); Jae-Beom Choi, Yongin (KR); Kwan-Wook Jung, Yongin (KR); Kwang-Hae Kim, Yongin (KR); Ga-Young Kim, Yongin (KR)

(73) Assignee: Samsung Display Co. Ltd., Yongin (KR)

( * ) Notice: Subject to any disclaimer, the term of this patent is extended or adjusted under 35 U.S.C. 154(b) by 281 days.

(21) Appl. No.: 13/486,964

(22) Filed: Jun. 1, 2012

(65) Prior Publication Data

US 2013/0127472 A1    May 23, 2013

(30) Foreign Application Priority Data

Nov. 17, 2011 (KR) ........................ 10-2011-0120345

(51) Int. Cl.
*H01L 21/66* (2006.01)
*H01L 27/32* (2006.01)
*H05B 33/10* (2006.01)
*H01L 51/00* (2006.01)

(52) U.S. Cl.
CPC ............ *H01L 27/3276* (2013.01); *H01L 22/30* (2013.01); *H05B 33/10* (2013.01); *H01L 51/0031* (2013.01)

(58) Field of Classification Search
CPC ......... H01L 22/00; H01L 22/10; H01L 22/12; H01L 22/13; H01L 22/30; H01L 22/32; H01L 51/0031; H01L 27/3276
USPC .............................................. 257/40; 324/414
See application file for complete search history.

(56) References Cited

U.S. PATENT DOCUMENTS

| | | | |
|---|---|---|---|
| 7,875,880 B2 * | 1/2011 | Lee ................................. | 257/40 |
| 7,897,965 B2 * | 3/2011 | Yoon et al. ...................... | 257/48 |
| 2002/0079920 A1 | 6/2002 | Fujikawa et al. | |
| 2006/0147650 A1 * | 7/2006 | Park .............................. | 428/1.1 |
| 2008/0283836 A1 * | 11/2008 | Lee ................................. | 257/59 |
| 2011/0133636 A1 | 6/2011 | Matsuo et al. | |
| 2012/0104395 A1 * | 5/2012 | Kim et al. ....................... | 257/59 |

FOREIGN PATENT DOCUMENTS

| | | |
|---|---|---|
| KR | 10-0425969 B1 | 4/2004 |
| KR | 10-2006-0082096 A | 7/2006 |
| KR | 10-2007-0067401 A | 6/2007 |
| KR | 10-0943187 B1 | 2/2010 |
| KR | 10-2011-0015967 A | 2/2011 |
| KR | 10-2011-0050440 A | 5/2011 |

* cited by examiner

*Primary Examiner* — Cheung Lee
*Assistant Examiner* — Stephen Bradley
(74) *Attorney, Agent, or Firm* — Knobbe Martens Olson & Bear, LLP

(57) ABSTRACT

An organic light emitting display apparatus includes: a substrate on which a display area and a non-display area are defined; a first electrode disposed over the display area; an intermediate layer that is disposed over the first electrode and includes an organic emissive layer; a second electrode disposed over the intermediate layer; and a plurality of detection patterns displaced over the non-display area, each of which includes a first electrically conductive pattern layer formed of the same material as the first electrode and a second electrically conductive pattern layer that is formed over the first electrically conductive pattern layer.

10 Claims, 4 Drawing Sheets

ORGANIC LIGHT EMITTING DISPLAY APPARATUS AND METHOD OF INSPECTING PATTERNS OF THE ORGANIC LIGHT EMITTING DISPLAY APPARATUS

CROSS-REFERENCE TO RELATED PATENT APPLICATION

This application claims the benefit of Korean Patent Application No. 10-2011-0120345, filed on Nov. 17, 2011, in the Korean Intellectual Property Office, the disclosure of which is incorporated herein in its entirety by reference.

BACKGROUND

1. Field

The present disclosure relates to an organic light emitting display apparatus and a method of inspecting the same.

2. Description of the Related Technology

Recently, flat panel display apparatuses widely used as they are thin and portable. Among the flat panel display apparatuses, organic light emitting display apparatuses are self-emissive and have a wide viewing angle, an excellent contrast, and a high response speed. Thus, the organic light emitting display apparatuses are being noticed as next-generation display apparatuses.

An organic light emitting display apparatus includes a first electrode, a second electrode and an intermediate layer disposed between the first and second electrodes. The intermediate layer includes an organic emissive layer, and when a voltage is applied to the first electrode and the second electrode, visible rays are emitted from the organic emissive layer.

The organic light emitting display apparatus may include various thin layers including the first electrode, the intermediate layer, and the second electrode, and these thin layers may be formed to have predetermined patterns. In order to increase the resolution of the organic light emitting display apparatus, sizes of the patterns of the thin layers have become small. However, it is difficult to form precise thin layer patterns.

The foregoing discussion is to provide general background information, and does not constitute an admission of the prior art.

SUMMARY

One aspect of the present invention provides an organic light emitting display apparatus whose electrical characteristics may be easily improved.

Another aspect of the present invention also provides a method of inspecting patterns of an organic light emitting display apparatus.

According to an aspect of the present invention, there is provided an organic light emitting display apparatus comprising: a substrate on which a display area and a non-display area are defined; a first electrode disposed over the display area; an intermediate layer that is disposed over the first electrode and comprises an organic emissive layer; a second electrode disposed over the intermediate layer; and a plurality of detection patterns disposed over the non-display area, each of which includes a first electrically conductive pattern layer formed of the same material as the first electrode and a second electrically conductive pattern layer that is formed over the first electrically conductive pattern layer.

The first electrically conductive pattern layer and the first electrode may be formed on the same layer.

The plurality of detection patterns may have the substantially same length.

The organic light emitting display apparatus may further comprise a thin film transistor that is disposed over the display area and electrically connected to the first electrode, the thin film transistor comprising an active layer, a gate electrode, a source electrode, and a drain electrode, wherein the detection patterns include the same material as a material for forming the gate electrode.

The detection patterns and the gate electrode may be formed on the same layer.

The gate electrode may include a first electrically conductive layer and a second electrically conductive layer formed over the first electrically conductive layer, wherein the first electrically conductive pattern layer of the detection patterns is formed of the same material as a material for forming the first electrically conductive layer, and the second electrically conductive pattern layer of the detection patterns is formed of the same material as the second electrically conductive layer.

The first electrode and the gate electrode may be formed on the same layer.

The first electrode and the first electrically conductive pattern layer may include a transmissive electrically conductive material.

The transmissive electrically conductive material may comprise at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The apparatus may further comprise two electrically conductive pads, and the plurality of detection patterns are disposed between the two electrically conductive pads, and two of the detection patterns adjacent to the electrically conductive pads may be connected to the electrically conductive pads, respectively.

According to an aspect of the present invention, there is provided a method of inspecting an organic light emitting display apparatus, the method comprising; providing an organic light emitting display apparatus comprising: a substrate on which a display area and a non-display area are defined; a first electrode disposed over the display area; an intermediate layer that is disposed over the first electrode and comprises an organic emissive layer; a second electrode disposed over the intermediate layer; and a plurality of detection patterns disposed over the non-display area, each of which includes a first electrically conductive pattern layer formed of the same material as the first electrode and a second electrically conductive pattern layer that is formed over the first electrically conductive pattern layer, and applying an electric current between first and second ends of each of the detection patterns to measure a potential difference between the first and second ends.

The method may further comprise determining whether the measured potential differences of the plurality of detection patterns are substantially same or not.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS

Embodiments of the present invention will now be described more fully with reference to the accompanying drawings, in which embodiments of the invention are shown. Expressions such as "at least one of," when preceding a list of elements, modify the entire list of elements and do not modify the individual elements of the list.

Figure 1:
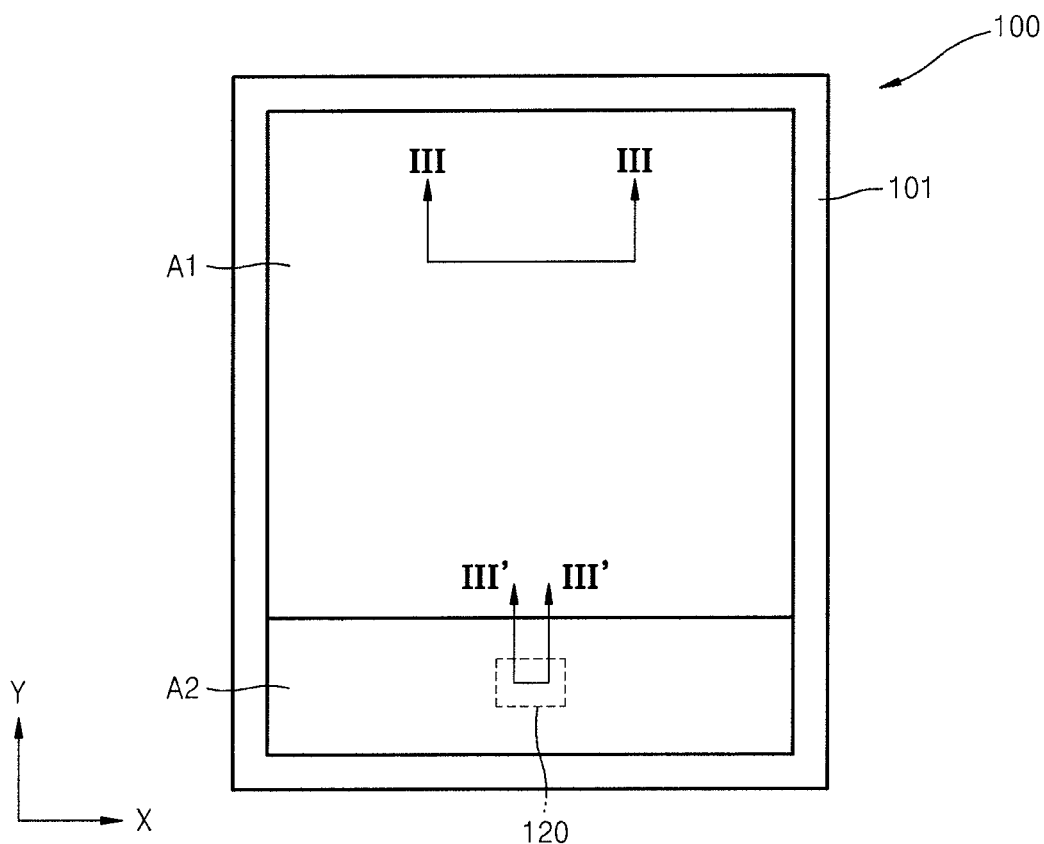
FIG. 1 is a schematic plan view of an organic light emitting display apparatus according to an embodiment of the present invention.
Figure 2:
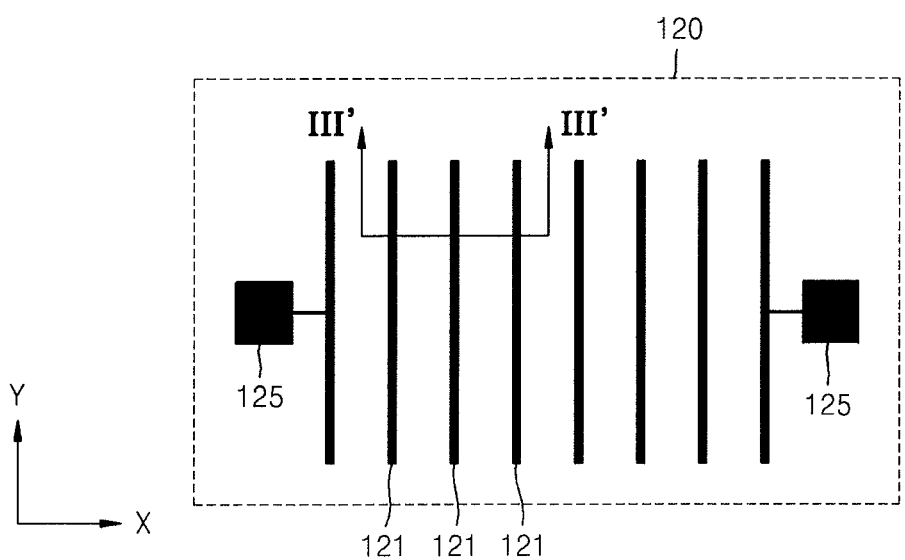
FIG. 2 is an expanded view of a detection unit of the organic light emitting display apparatus illustrated in FIG. 1.
Figure 3:
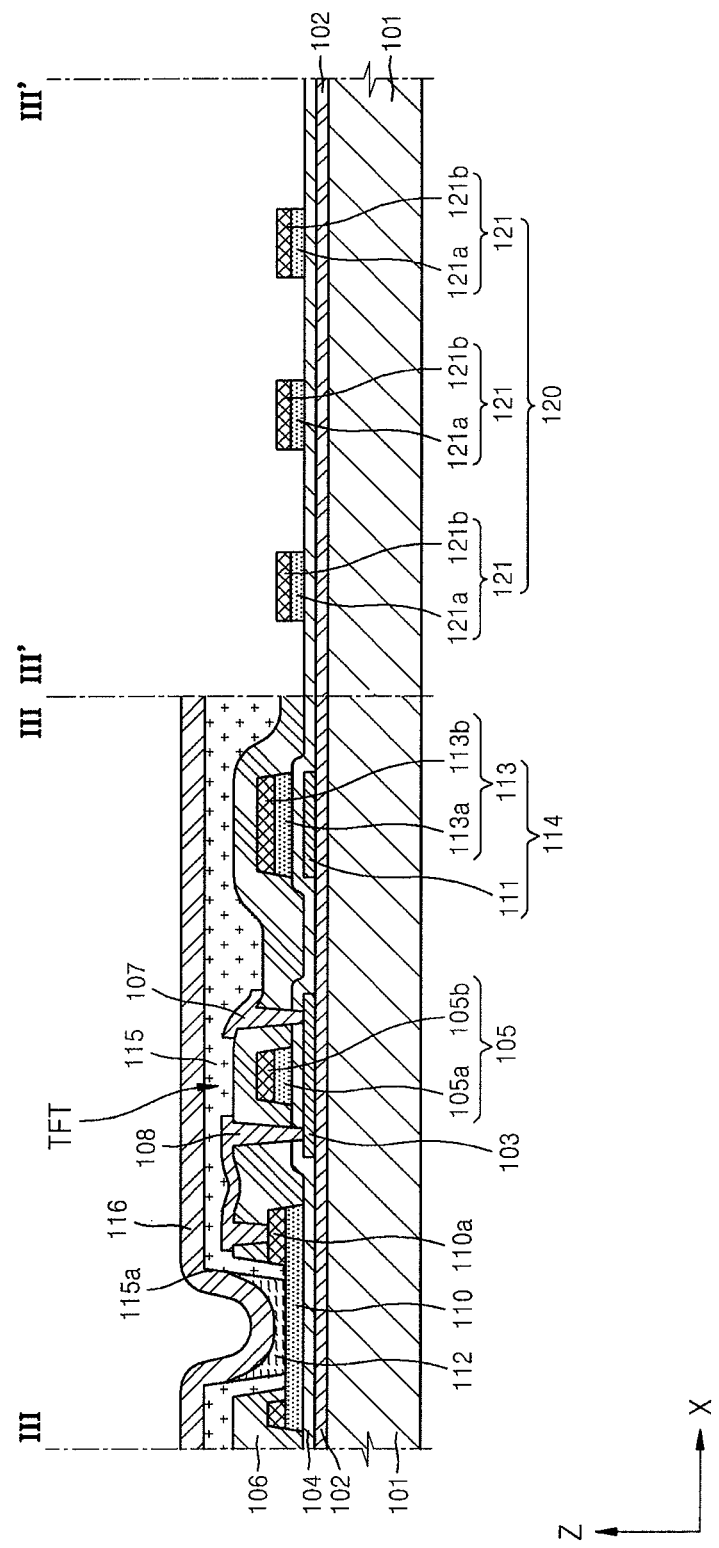
FIG. 3 is a cross-sectional view of the organic light emitting display apparatus of FIG. 1 cut along a line and a line III'-III'.

FIG. 1 is a schematic plan view of an organic light emitting display apparatus 100 according to an embodiment of the present invention. FIG. 2 is an expanded view of a detection unit or structure of the organic light emitting display apparatus 100 illustrated in FIG. 1. FIG. 3 is a cross-sectional view of the organic light emitting display apparatus 100 of FIG. 1 cut along a line III-III and a line III'-III'.

Referring to FIGS. 1 through 3, the organic light emitting display apparatus 100 includes a substrate 101, a first electrode 110, an intermediate layer 112, a second electrode 116, a thin film transistor (TFT), and a detection unit 120.

The substrate 101 may be formed of a transparent glass material containing $SiO_2$ as a main component, but is not limited thereto; the substrate 101 may also be formed of a transparent plastic substrate. The plastic substrate may be formed of an insulating organic material selected from the group consisting of polyethersulphone (PES), polyacrylate (PAR), polyetherimide (PEI), polyethylene napthalate (PEN), polyethyleneterepthalate (PET), polyphenylene sulfide (PPS), polyarylate, polyimide, polycarbonate (PC), cellulose triacetate (TAC), and cellulose acetate propionate (CAP).

Also, the substrate 101 may be formed of a metal and may be a foil.

A display area A1 and a non-display area A2 are defined on the substrate 101. Referring to FIG. 1, the non-display area A2 is disposed at an edge of the display area A1. However, the embodiments of the present invention are not limited thereto. That is, the non-display areas may be formed at opposite edges of the display area A1 or the non-display area may be formed to surround the display area A1.

A plurality of sub-pixels (not shown) emitting visible rays are formed in the display area A1. Also, the first electrode 110, the intermediate layer 112, and the second electrode 116 are formed in each of the sub-pixels. This configuration is illustrated in detail in FIG. 3 and will be described later.

In the non-display area A2, at least one detection unit or structure 120 is disposed. The detection unit 120 includes a plurality of detection patterns or stripes 121. In embodiments, the detection patterns 121 may be extended in parallel. Also, as illustrated in FIG. 2, the detection patterns 121 may be arranged at predetermined intervals, and be spaced apart from one another, in principle. Also, the detection patterns 121 may be formed to have the same lengths.

Each of the detection patterns 121 includes a first electrically conductive pattern layer 121a and a second electrically conductive pattern layer 121b. That is, the second electrically conductive pattern layer 121b is formed on the first electrically conductive pattern layer 121a. Also, in one embodiment, electrically conductive pads 125 are optionally disposed adjacent to the two outermost patterns among the plurality of detection patterns 121, but the embodiment of the present invention is not limited thereto. Alternatively, the organic light emitting display apparatus 100 according to the current embodiment of the present invention may include just the detection patterns 121 without the electrically conductive pads 125.

Patterns of the organic light emitting display apparatus 100 are inspected by applying an electric current between two ends of each of the detection patterns 121. An inspection method by using the detection patterns 121 or the electrically conductive pads 125 will be described later.

A TFT is disposed on the substrate 101. The TFT includes an active layer 103, a gate electrode 105, a source electrode 107, and a drain electrode 108. The TFT is electrically connected to the first electrode 110.

The configuration of the organic light emitting display apparatus 100 will be described in detail with reference to FIG. 3.

A buffer layer 102 is formed on the substrate 101. The buffer layer 102 provides a planar surface on the substrate 101 and prevents penetration of water or foreign materials toward the substrate 101.

The active layer 103 having a predetermined pattern is formed on the buffer layer 102. The active layer 103 may be formed of an inorganic semiconductor such as amorphous silicon or polysilicon. Also, the active layer 103 may be formed of other various materials such as an organic semiconductor or an oxide semiconductor. The active layer 103 includes a source area, a drain area, and a channel area.

According to another embodiment of the present invention, a capacitor 114 may be further formed. For example, a first capacitor electrode 111 of the capacitor 114 may be formed on the buffer layer 102. The first capacitor electrode 111 may be formed of the same material as the active layer 103.

A gate insulating layer 104 is formed on the buffer layer 102 to cover the active layer 103 and the first capacitor electrode 111. The gate insulating layer 104 may be formed over the display area A1 and the non-display area A2.

The gate insulating layer 104 may be formed of various insulating materials. For example, the gate insulating layer 104 may be formed of an organic material or an inorganic material such as $SiN_x$ or $SiO_2$.

In embodiments, the gate electrode 105, the first electrode 110, and the detection unit 120 are formed on the gate insulating layer 104. Particularly, the gate electrode 105, the first electrode 110, and the detection unit 120 are formed immediately on the gate insulating layer 104 to contact the gate insulating layer 104.

The gate electrode 105 includes a first electrically conductive layer 105a and a second electrically conductive layer 105b.

The first electrically conductive layer 105a includes a transmissive electrically conductive material; in detail, the first electrically conductive layer 105a may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second electrically conductive layer 105b may be formed on the first electrically conductive layer 105a and may include a metal or a metal alloy such as Mo, MoW, or Al alloys. For example, the second electrically conductive layer 105b may have a Mo/Al/Mo stack structure.

The first electrode 110 includes a transmissive electrically conductive material and may be formed of the same material as the first electrically conductive layer 105a. An electrically conductive portion 110a is formed on a predetermined area on the first electrode 110 and of the same material as the second electrically conductive layer 105b.

According to another embodiment of the present invention, a second capacitor electrode 113 of the capacitor 114 may be formed on the gate insulating layer 104. Particularly, second capacitor electrode 113 of the capacitor 114 can be formed immediately on the gate insulating layer 104 to contact the gate insulating layer 104. The second capacitor electrode 113 includes a first layer 113a and a second layer 113b. The first layer 113a is formed of the same material as the first electrically conductive layer 150a, and the second layer 113b is formed of the same material as the second electrically conductive layer 105b.

As described above, the detection unit 120 includes the plurality of detection patterns 121, and each of the detection patterns 121 includes the first electrically conductive pattern layer 121a and the second electrically conductive pattern layer 121b.

The first electrically conductive pattern layer 121a is formed of the same material as the first electrically conductive layer 105a, and the second electrically conductive pattern layer 121b is formed of the same material as the second electrically conductive layer 105b.

An interlayer insulating layer 106 is formed on the first electrode 110, the gate electrode 105, and the second capacitor electrode 113. The interlayer insulating layer 106 may include various insulating materials such as an organic material or an inorganic material.

A source electrode 107 and a drain electrode 108 are formed on the interlayer insulating layer 106. The source electrode 107 and the drain electrode 108 are formed to be connected to the active layer 103.

The source electrode 107 and the drain electrode 108 may be formed of a metal such as Au, Pd, Pt, Ni, Rh, Ru, Ir, Os, Al, Mo, Nd, Mo, W, or Ti or an alloy containing these metals, but are not limited thereto.

In addition, any one of the source electrode 107 and the drain electrode 108 may be electrically connected to the first electrode 110. Referring to FIG. 3, the drain electrode 108 is electrically connected to the first electrode 110. In detail, the drain electrode 108 is in contact with the electrically conductive portion 110a.

A pixel defining layer 115 is formed on the interlayer insulating layer 106 to cover the TFT. The pixel defining layer 115 includes an opening portion 115a, and the opening portion 115a is formed to overlap a predetermined area of an upper surface of the first electrode 110.

An intermediate layer 112 is formed to correspond to the opening portion 115a. A second electrode 116 is formed on the intermediate layer 112.

Although not illustrated in the drawings, a sealing member (not shown) may be formed on the second electrode 116 to correspond to a surface of the substrate 101. The sealing member (not shown) is formed to protect the intermediate layer 112 or the like from water or oxygen from the outside. The sealing member (not shown) may be formed of a glass or plastic, or may have a structure in which a plurality of organic materials and inorganic materials are overlapped.

Figure 4:
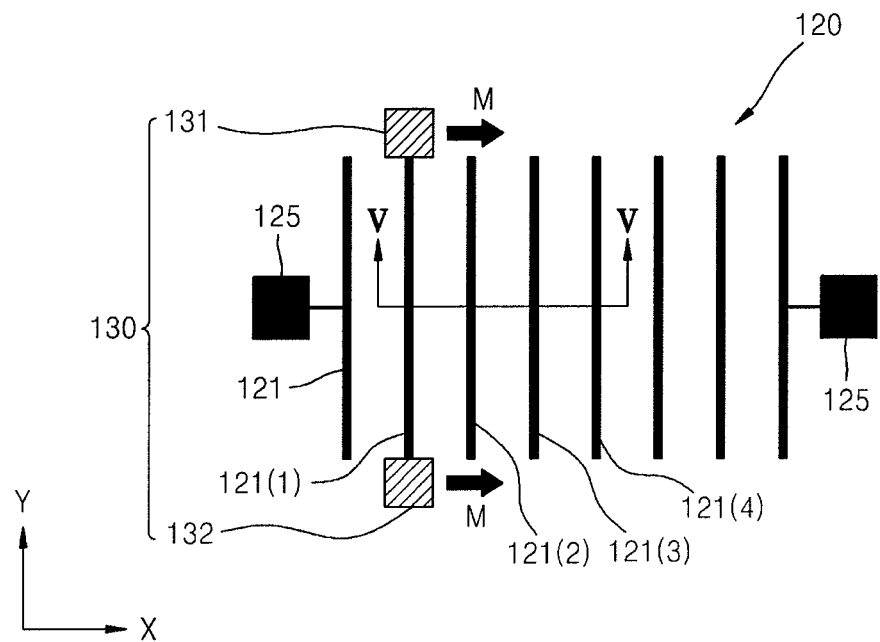
FIG. 4 is a schematic view for explaining a method of inspecting a pattern of the organic light emitting display apparatus by using the detection unit of FIG. 1, according to an embodiment of the present invention.
Figure 5:
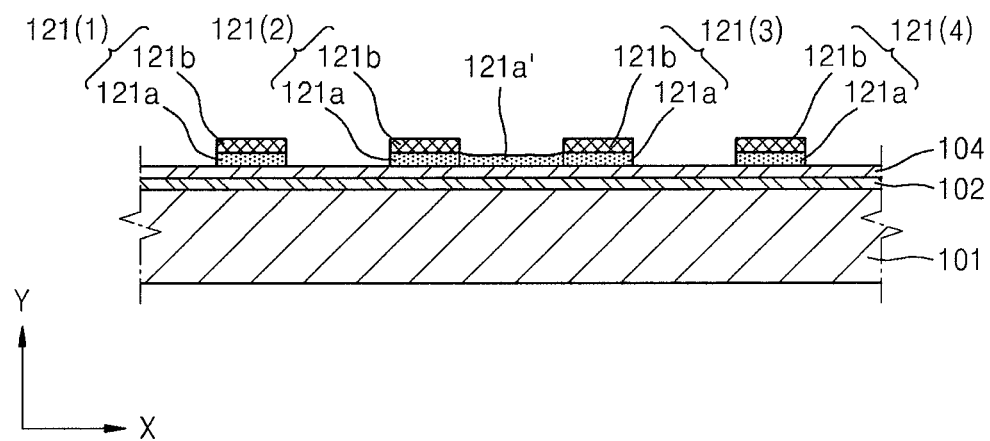
FIG. 5 is a cross-sectional view of a portion of the detection unit of FIG. 4 cut along a line V-V.

FIG. 4 is a schematic view for explaining a method of inspecting a pattern of the organic light emitting display apparatus 100 by using the detection unit 120 of FIG. 1, according to an embodiment of the present invention. FIG. 5 is a cross-sectional view of a portion of the detection unit of FIG. 4 cut along a line V-V.

A method of inspecting a pattern of the organic light emitting display apparatus 100 of FIGS. 1 through 3 will be described with reference to FIGS. 4 and 5.

To inspect patterns, an electric power supply 130 including an electric power feeding member or terminal 131 and an electric power receiving member terminal 132 is prepared. Then the electric power feeding member 131 and the electric power receiving member 132 are sequentially connected to each of the detection patterns 121 of the detection unit 120.

In detail, as illustrated in FIG. 4, the electric power feeding member 131 is connected to a first end of a detection pattern 121(1), and the electric power receiving member 132 is connected to a second end of the detection pattern 121(1). Then a voltage is applied to the detection pattern 121(1) by using the electric power feeding member 131 and the electric power receiving member 132 to flow an electric current between the first and second ends of the detection pattern 121(1). Thus, a potential difference is generated between the first and second ends of the detection pattern 121(1). The potential difference for the detection pattern 121(1) is measured.

Then, the electric power feeding member 131 and the electric power receiving member 132 are transported in a direction M (direction of the arrow) of FIG. 4. That is, the electric power feeding member 131 is connected to a first end of a detection pattern 121(2), and the electric power receiving member 132 is connected to a second end of the detection pattern 121(2). By applying a voltage to the detection pattern 121(2) by using the electric power feeding member 131 and the electric power receiving member 132, a current is generated between the first and second ends of the detection pattern 121(2). That is, a potential difference is generated between the first and second ends of the detection pattern 121(2). The potential difference for the detection pattern 121(2) is measured.

Then, the electric power feeding member 131 and the electric power receiving member 132 are transported in the direction M (direction of the arrow) of FIG. 4. That is, the electric power feeding member 131 is connected to a first end of a detection pattern 121(3), and the electric power receiving member 132 is connected to a second end of the detection pattern 121(3). By applying a voltage to the detection pattern 121(3) by using the electric power feeding member 131 and the electric power receiving member 132, a current is generated between the first and second ends of the detection pattern 121(3). That is, a potential difference is generated between the first and second ends of the detection pattern 121(3). The potential difference for the detection pattern 121(3) is measured.

Then, the electric power feeding member 131 and the electric power receiving member 132 are transported in the direction M (direction of the arrow) of FIG. 4. That is, the electric power feeding member 131 is connected to a first end of a detection pattern 121(4), and the electric power receiving member 132 is connected to a second end of the detection pattern 121(4). By applying a voltage to the detection pattern 121(4) by using the electric power feeding member 131 and the electric power receiving member 132, a current is generated between the first and second ends of the detection pattern 121(4). That is, a potential difference is generated between the first and second ends of the detection pattern 121(4). The potential difference for the detection pattern 121(4) is measured.

A potential difference between the first and second ends of each of the detection patterns 121 of the detection unit 120 is measured or monitored in the above-described manner.

Meanwhile, as illustrated in FIG. 5, a defective pattern 121a' may be formed among the detection patterns 121. In other words, this undesirable defective pattern 121a' may remain between the detection patterns 121(2) and 121(3). As a result, the detection pattern 121(2) and the detection pattern 121(3) are electrically connected to each other.

In this case, when a potential difference between the first and second ends of each of the detection patterns 121 shown in FIG. 4 is measured using the electric power feeding member 131 and the electric power receiving member 132 in the above-described manner, uniform potential differences are measured from normal detection patterns such as the detection pattern 121(1) and the detection pattern 121(4). However, defective detection patterns like the detection pattern 121(2) and the detection pattern 121(3) shown in FIG. 5 can have different potential differences from the normal detection patterns 121(1) and 121(4) shown in FIG. 5.

Thus, defective patterns of the organic light emitting display apparatus 100 may be easily identified or monitored using the above-described method. This will be further described in detail. In embodiments, for accuracy of measurement, the detection patterns 121 may be formed to have the same lengths.

In the organic light emitting display apparatus 100 according to the current embodiment of the present invention, the first electrode 110 is formed on the substrate 101. The first electrode 110 is patterned usually by using a photo-lithography method. That is, the first electrode 110 is formed to have a desired pattern by etching after being subject to an exposure. During this process, a material for forming the first electrode 110 is not completely etched but remains partially even after the manufacture of the organic light emitting display apparatus 110 is completed. When the organic light emitting display apparatus 100 with such defects is used, abnormal electrical characteristics and poor image quality appear in the organic light emitting display apparatus 100 due to the remaining material. However, it is difficult to sense the defective pattern 121a', in which the material of the first electrode 110 partially remains. On the other hand, according to the current embodiment of the present invention, when forming the first electrode 110, the detection unit 120 including the detection patterns 121 is formed on the non-display area A2 by using the same material as that of the first electrode 110. Then, directly after forming the first electrode 110 or after other subsequent processes, potential differences in the detection patterns 121 are monitored by using the electric power feeding member 131 and the electric power receiving member 132. Through this, it is determined whether the detection patterns 121 are formed normally or a defective pattern 121a' is formed. If a defective pattern 121a' is monitored between the detection patterns 121, it indicates that steps or processes for etching the deposited material for forming the first electrode 110 are not performed completely or properly. Thus, an additional process for removing the defects in the etching operation such as an additional etching operation may be performed to minimize defects of the electrodes which may cause defects of the product.

Also, since the first electrode 110 includes a transmissive, electrically conductive material, it is difficult to sense the defective patterns of the first electrode 110 visually or optically. However, in the organic light emitting display apparatus 100 according to the aforementioned embodiments of the present invention, defects may be easily sensed or detected by using the detection unit 120.

In embodiments, the first electrode 110 and the electrically conductive layer 105a are formed on the same layer and formed with the same material. The electrically conductive portion 110a and the second electrically conductive layer 105b are formed on the first electrode 110 and the first electrically conductive layer 105a, respectively, and formed with the same material. In some embodiments, the pair of the first electrode 110 and the electrically conductive portion 110a and the pair of the first electrically conductive layer 105a and the second electrically conductive layer 105b are formed to be disposed between the gate insulation layer 104 and the interlayer insulation layer 106.

Likewise, in embodiments, the first layer 113a of the second capacitor electrode 113 and the electrically conductive layer 105a are formed on the same layer and formed with the same material. The second layer 113b of the second capacitor electrode 113 and the second electrically conductive layer 105b are formed on the first layer 113a and the first electrically conductive layer 105a, respectively, and formed with the same material. In some embodiments, the pair of the first layer 113a and the second layer 113b of the second capacitor electrode 113 and the pair of the first electrically conductive layer 105a and the second electrically conductive layer 105b are formed to be disposed between the gate insulation layer 104 and the interlayer insulation layer 106.

As such, in embodiment, in order to form electrode portions 110, 110a, 105a, 105b, 103a and 103b according to some embodiments, a thin film layer for the electrode portions 110, 105a and 103a is formed with a transmissive conducive material, and then, another thin film layer for the electrode portions 110a, 105b, and 103b is formed thereon using a different metal material such as Mo, MoW, or Al Then, the first electrode 110, the gate electrode 105, and the second capacitor 113 are patterned by exposure and etching. Sometimes, the transmissive, electrically conductive material in the lower thin film layer may be insufficiently etched and some portions of the transmissive, electrically conductive material may undesirably remain as compared to the metal Mo, MoW, or Al contained in the upper thin film layer. The undesired remaining portions may cause deterioration of electrical characteristics of the organic light emitting display apparatus 100 or deteriorate image quality thereof. However, according to the aforementioned embodiments of the present invention, whether an undesired remaining portion is generated or not may be easily recognized by using the detection unit or structure 120. In particular, the completeness of patterning the electrode portions 110, 105a, 103a can be predicted or indirectly inspected by monitoring the electrical characteristics of the detection patterns. This allows additional opportunity for the removal of such undesirable remaining portions, thereby minimizing the problems described above.

Selectively, the electrically conductive pads 125 may be disposed as illustrated in FIG. 4 etc. In normal cases, when a voltage is applied to the electrically conductive pads 125 on the two sides, no current flows. However, if there is a defective pattern between the detection patterns 121 and thus all of the detection patterns 121 are electrically connected, a current flows between the electrically conductive pads 125 on the two sides, and inspection of a defective pattern may be performed therethrough. This method according to this alternative embodiment is simpler than the above embodiment but precision may be low. Obviously, the electrically conductive pads 125 may be omitted as described above.

While the interlayer insulating layer 106 and the pixel defining layer 115 are not formed on the detection unit 120 in FIG. 3, the embodiment of the present invention is not limited thereto and the interlayer insulating layer 106 and the pixel defining layer 115 may be formed on the detection unit 120. In particular, the interlayer insulating layer 106 and the pixel defining layer 115 may be formed after monitoring by using the detection unit 120 and repairing by using the process such as additional etching.

Also, in embodiments, the first electrode 110 is formed on the same layer and of the same material as the first electrically conductive layer 105a of the gate electrode 105 to simplify the manufacturing operations (of the organic light emitting display apparatus 100) and reduce defects which are generated when forming the first electrode 110 and the gate electrode 105. Also, a thickness of the organic light emitting display apparatus 100 may be easily reduced.

Figure 6:
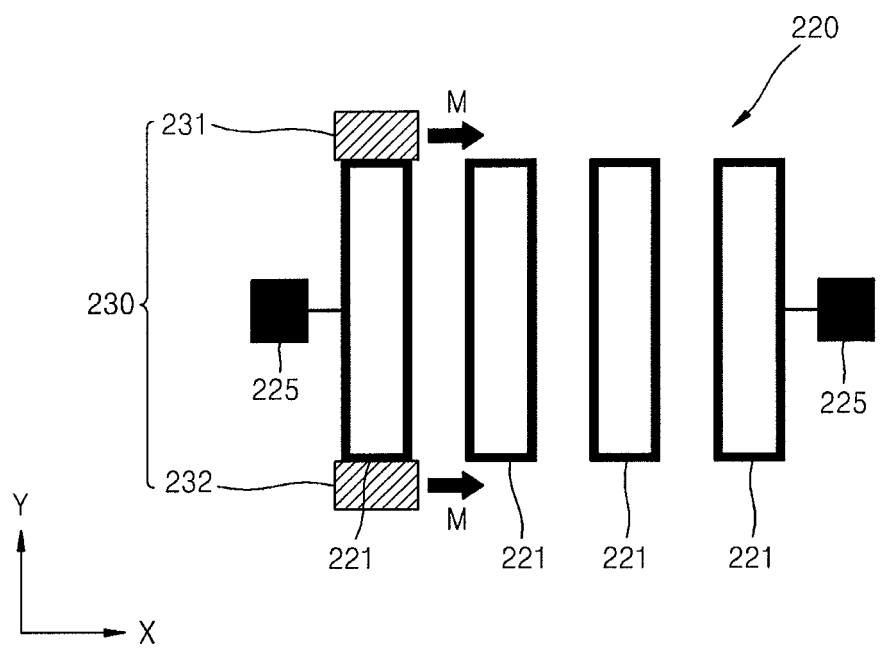
FIG. 6 is a plan view of a detection unit according to an embodiment of the present invention.

FIG. 6 is a plan view of a detection unit or structure 220 according to an embodiment of the present invention. Referring to FIG. 6, the detection unit 220 includes a plurality of detection patterns 221. The detection patterns 221 have a rectangular shape, that is, a shape that is formed by respectively connecting two o adjacent detection patterns 121 among the detection patterns 121 of FIG. 2. A method of inspecting a defective pattern by using an electric power feeding member 231 and an electric power receiving member 232 is similar to the method described in the previous embodiment, and thus detailed description thereof will be omitted.

According to the organic light emitting display apparatus and the method of inspecting patterns of the organic light emitting display apparatus of the embodiments of the present invention, electrical characteristics of the organic light emitting display apparatus may be easily improved.

While embodiments of the present invention has been particularly shown and described, it will be understood by those of ordinary skill in the art that various changes in form and details may be made therein without departing from the spirit and scope of the present invention as defined by the following claims.

What is claimed is:

1. An organic light emitting display apparatus comprising:
 a substrate comprising a major surface, wherein a display area and a non-display area are defined over the major surface;
 an array of pixels formed in the display area, each pixel comprising a first electrode and an organic emissive layer, the first electrode being made of a first conductive material;
 a second electrode disposed over the array of pixels; and
 a plurality of discrete conductive extensions formed in a side by side arrangement in the non-display area, each of which extends between two end points that are not electrically connected to circuits in either the non-display area or the display area, each discrete conductive extension comprising a first conductive layer and a second conductive layer formed over and contacting the first conductive layer, the first conductive layer made of the first conductive material.

2. The organic light emitting display apparatus of claim 1, wherein the first conductive layer of each discrete conductive extension is formed simultaneously with the first electrode.

3. The organic light emitting display apparatus of claim 1, wherein the plurality of discrete conductive extensions have the substantially same length in the direction.

4. The organic light emitting display apparatus of claim 1, further comprising a thin film transistor that is disposed in the display area and electrically connected to the first electrode, the thin film transistor comprising an active layer, a gate electrode, a source electrode, and a drain electrode.

5. The organic light emitting display apparatus of claim 4, wherein the second conductive layer and the gate electrode are formed of the same material.

6. The organic light emitting display apparatus of claim 4, wherein the gate electrode includes a first gate layer and a second gate layer formed over the first gate layer,
 wherein the first conductive layer of each discrete conductive extension is formed of the same material as the first gate layer of the gate electrode, and the second conductive layer of each discrete conductive extension is formed of the same material as the second gate layer of the gate electrode.

7. The organic light emitting display apparatus of claim 4, wherein the first electrode and the gate electrode are formed of the same material.

8. The organic light emitting display apparatus of claim 1, wherein the first electrode and the first conductive layer of each discrete conductive extension are made of a transparent material.

9. The organic light emitting display apparatus of claim 8, wherein the transparent material comprises at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

10. An organic light emitting display apparatus comprising:
 a substrate comprising a major surface, wherein a display area and a non-display area are defined over the major surface;
 an array of pixels formed in the display area, each pixel comprising a first electrode and an organic emissive layer, the first electrode being made of a first conductive material;
 a second electrode disposed over the array of pixels; and
 a plurality of discrete patterns formed in the non-display area, each discrete pattern comprising a first conductive layer and a second conductive layer formed over the first conductive layer, the first conductive layer made of the first conductive material, each discrete pattern comprising an extension elongated in a direction between two end points that do not further extend into the display area,
 the apparatus further comprising two electrically conductive pads,
 wherein the plurality of discrete patterns are disposed between the two electrically conductive pads, and wherein two of the discrete patterns adjacent to the electrically conductive pads are electrically connected to the electrically conductive pads, respectively.

* * * * *